United States Patent [19]

Iacono et al.

[11] Patent Number: 4,633,229

[45] Date of Patent: Dec. 30, 1986

[54] ELECTRONIC OUTDOOR WARNING SIREN

[75] Inventors: Joel G. Iacono, Dyer; Ronald J. Koval, Gary, both of Ind.

[73] Assignee: Federal Signal Corporation, Oak Brook, Ill.

[21] Appl. No.: 397,221

[22] Filed: Jul. 12, 1982

[51] Int. Cl.⁴ .......................... G08B 3/00; H04R 5/00; H05K 5/00

[52] U.S. Cl. ....................................... 340/391; 381/24; 181/144

[58] Field of Search .................... 340/391, 384 E, 405; 381/24, 82, 85; 181/143, 144, 147

[56] References Cited

U.S. PATENT DOCUMENTS

| | | | |
|---|---|---|---|
| 3,100,024 | 8/1963 | Leslie | 181/143 |
| 3,504,364 | 3/1970 | Abel | 340/384 E |
| 3,947,635 | 3/1976 | Frankman | 381/24 |
| 4,054,750 | 10/1977 | Montgomeny et al. | 381/24 X |

OTHER PUBLICATIONS

"Devices for Air Raid Warnings" National Bureau of Standerds, Oct. 23, 1942, Letter Circular LC-706.

*Primary Examiner*—John W. Caldwell, Sr.
*Assistant Examiner*—Tyrone Queen
*Attorney, Agent, or Firm*—Charles F. Pigott, Jr.

[57] ABSTRACT

Electronic outdoor warning siren systems which include a plurality of speakers arranged in one or more vertically spaced circular arrays of circumferentially spaced vertically oriented speakers to achieve substantially uniform coverage in all radial directions in a horizontal plane, and utilizing frequency variations in adjacent speakers in a given horizontal plane to minimize interference between sound signals from adjacent speakers thereby permitting closer spacing of speakers than would otherwise be feasible and providing uniform omni-directional sound propagation. The same frequency variations are also employed with a plurality of speakers oriented in the same direction and rotated through 360° to accomplish the same result of minimal interference and more uniform sound propagation.

9 Claims, 14 Drawing Figures

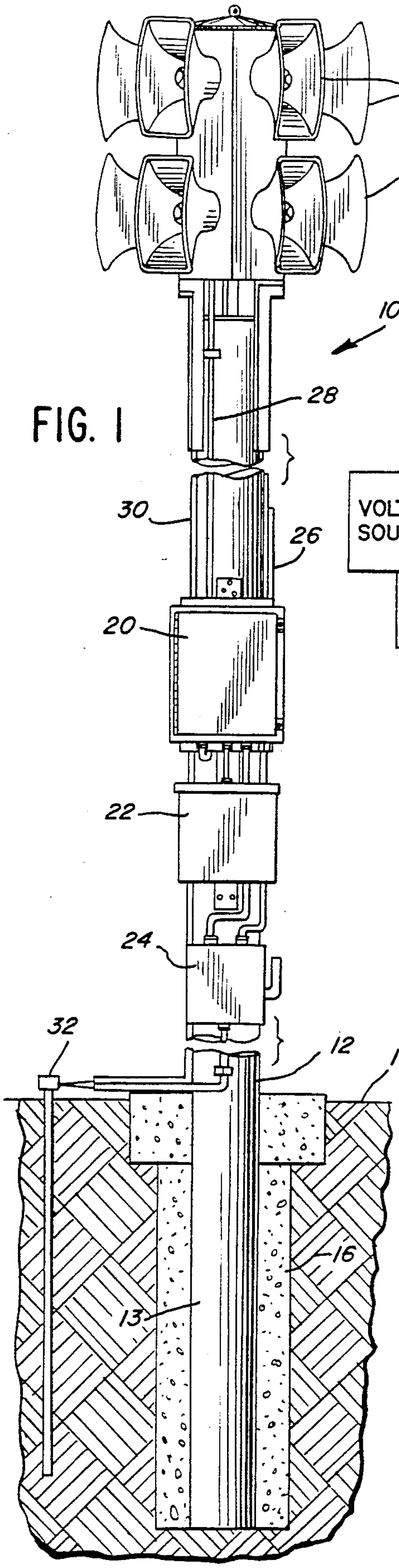
FIG. 1
FIG. 2
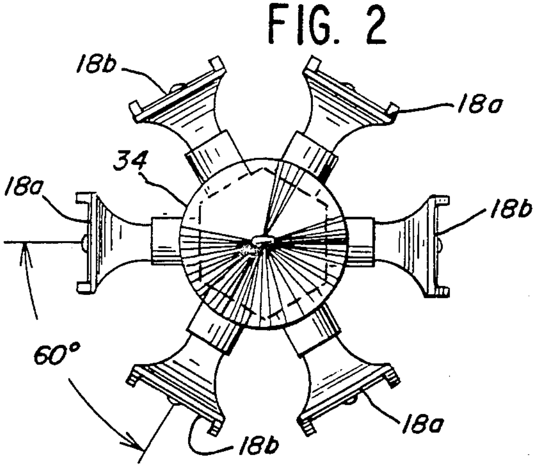
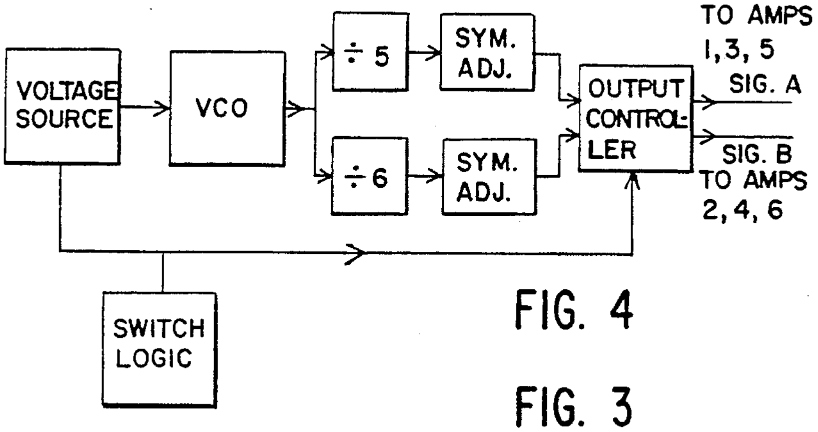
FIG. 4
FIG. 3
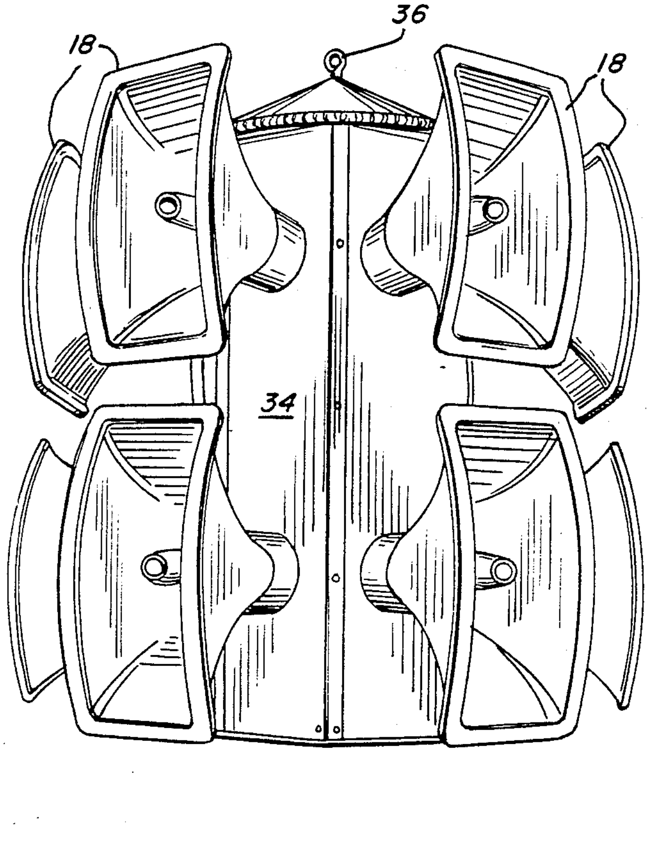

FIG. 5
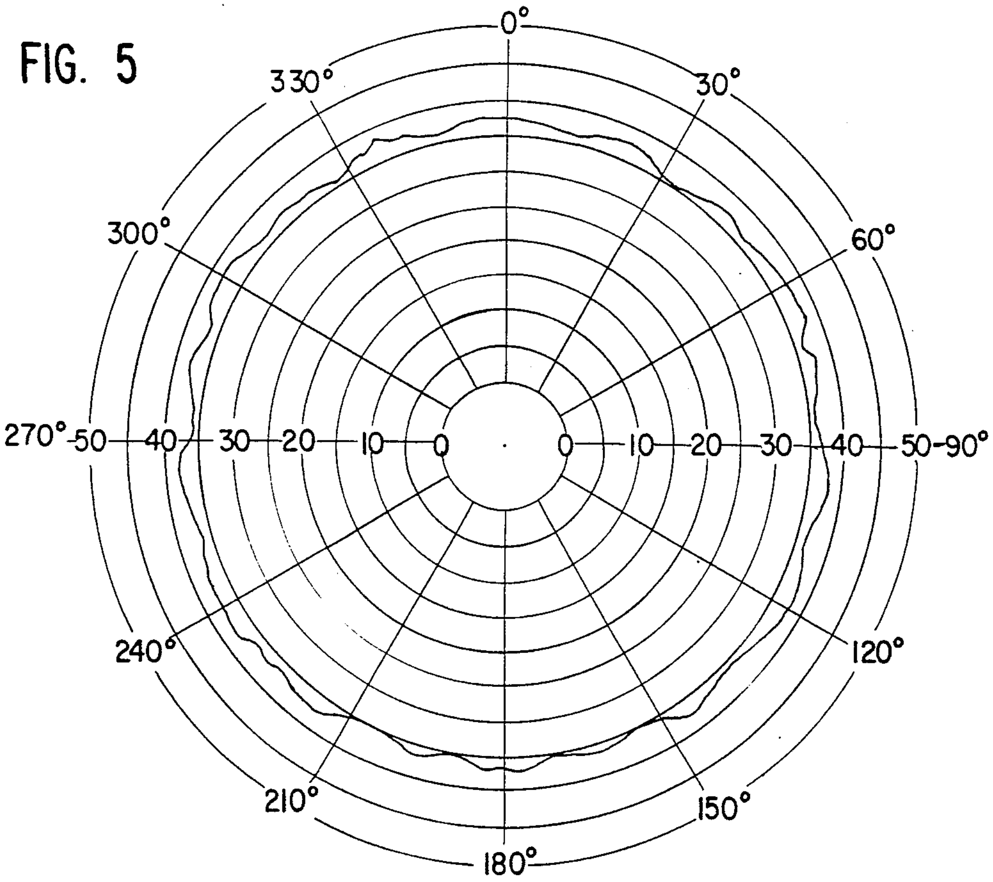
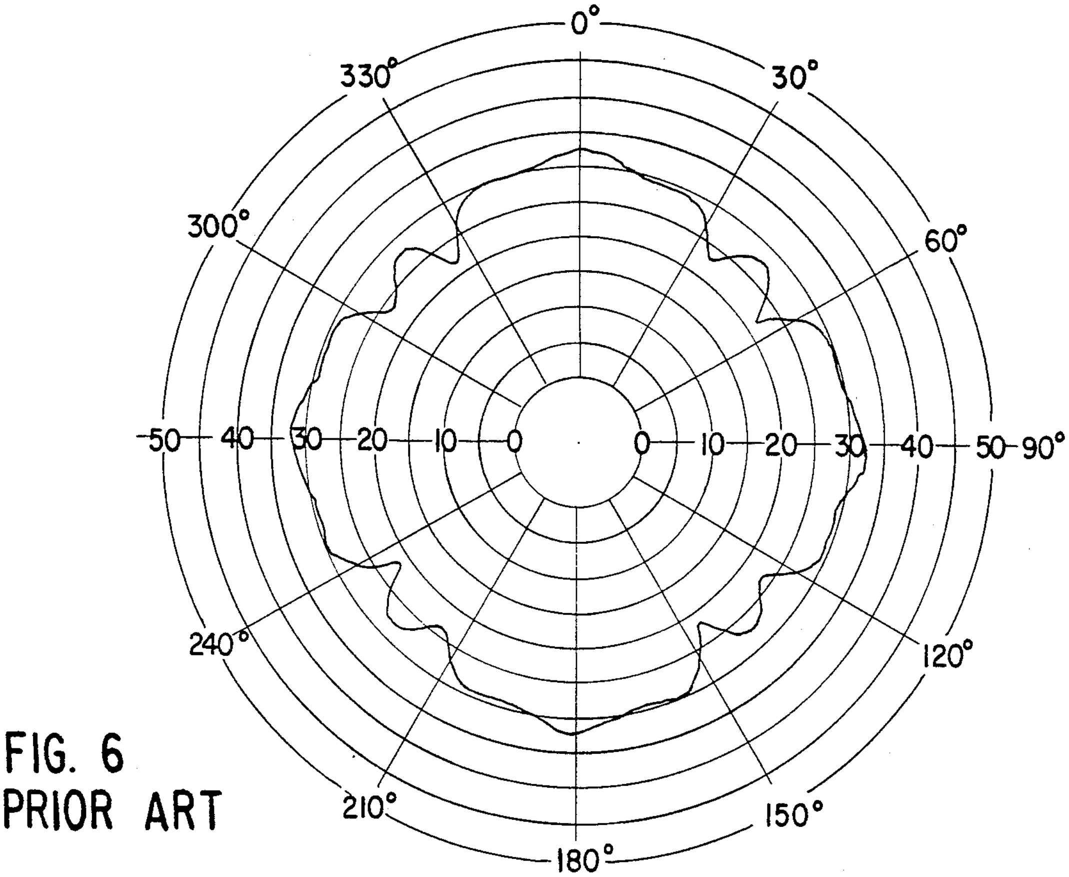
FIG. 6
PRIOR ART

FIG. 9
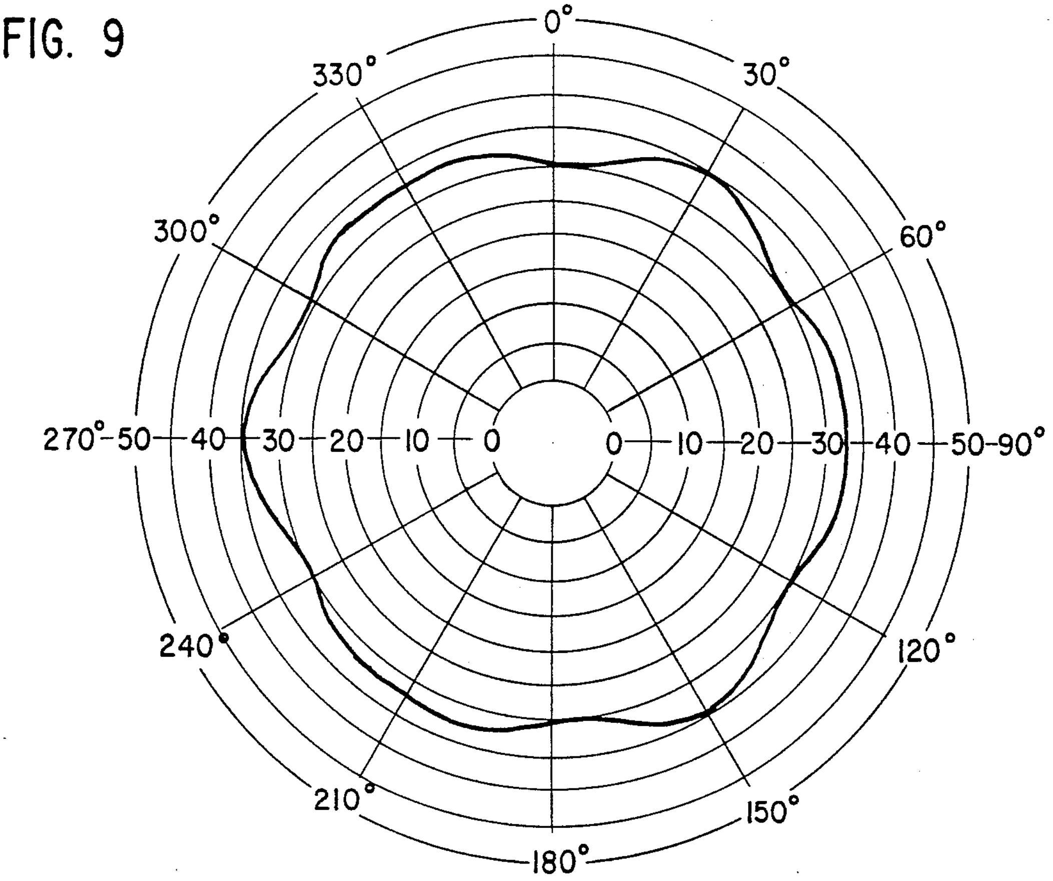
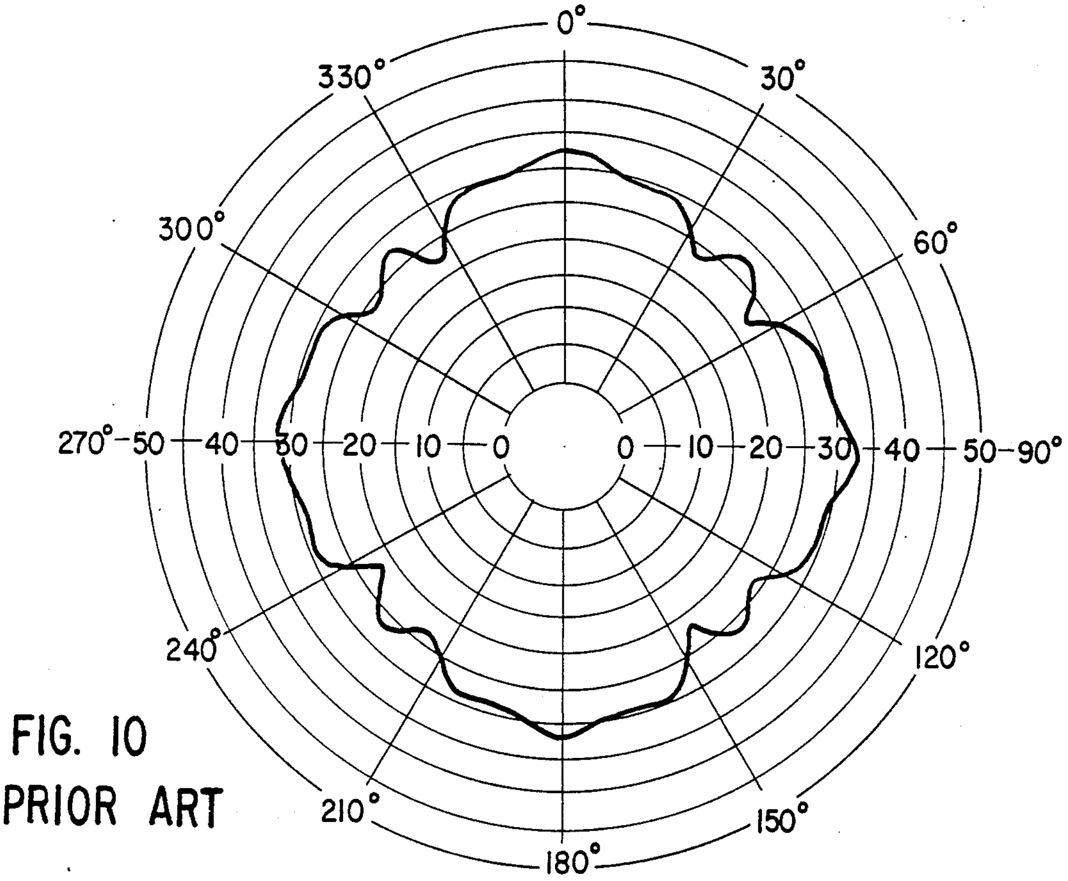
FIG. 10
PRIOR ART

FIG. 11
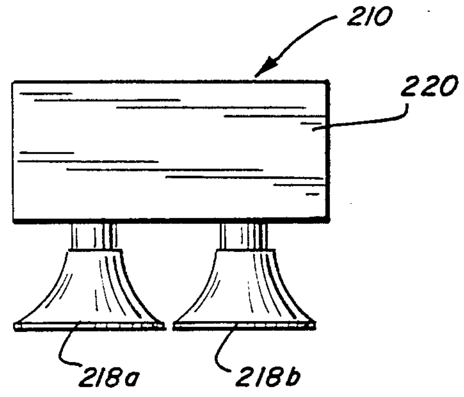
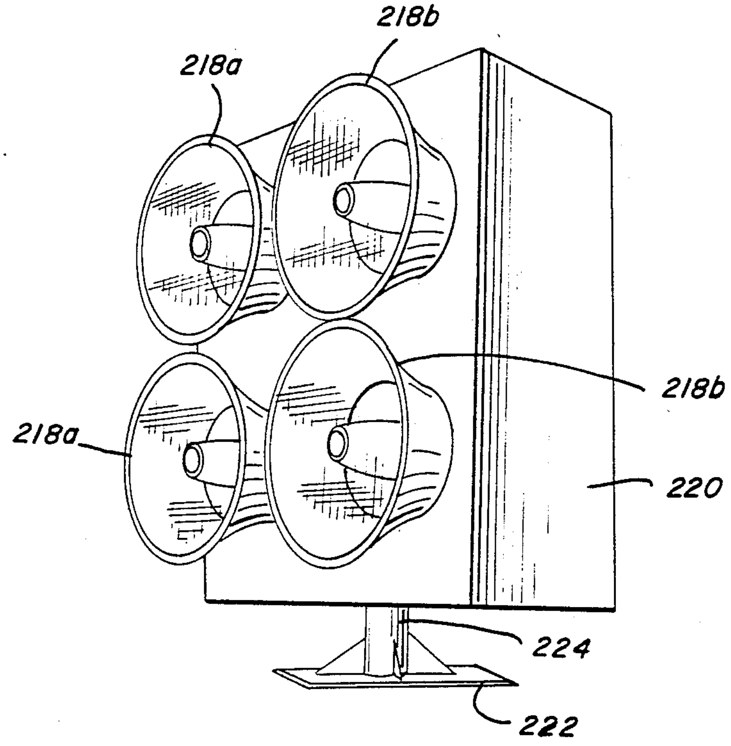
FIG. 12

FIG. 13
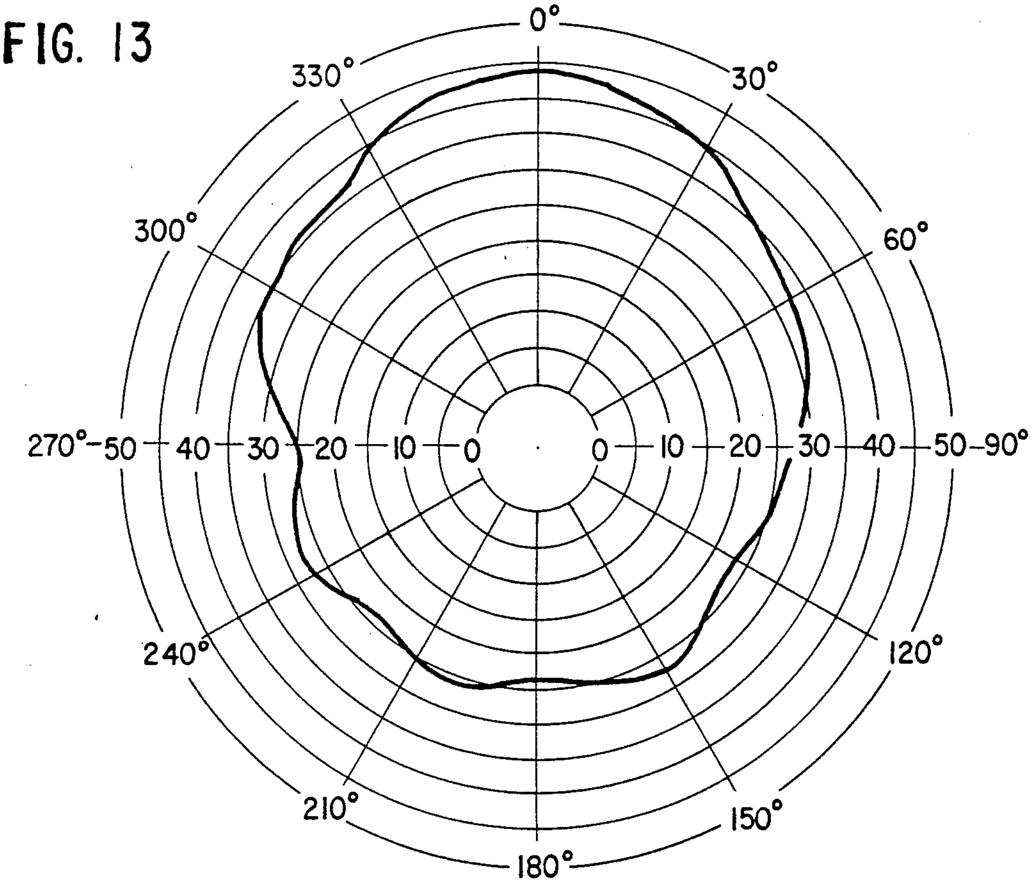
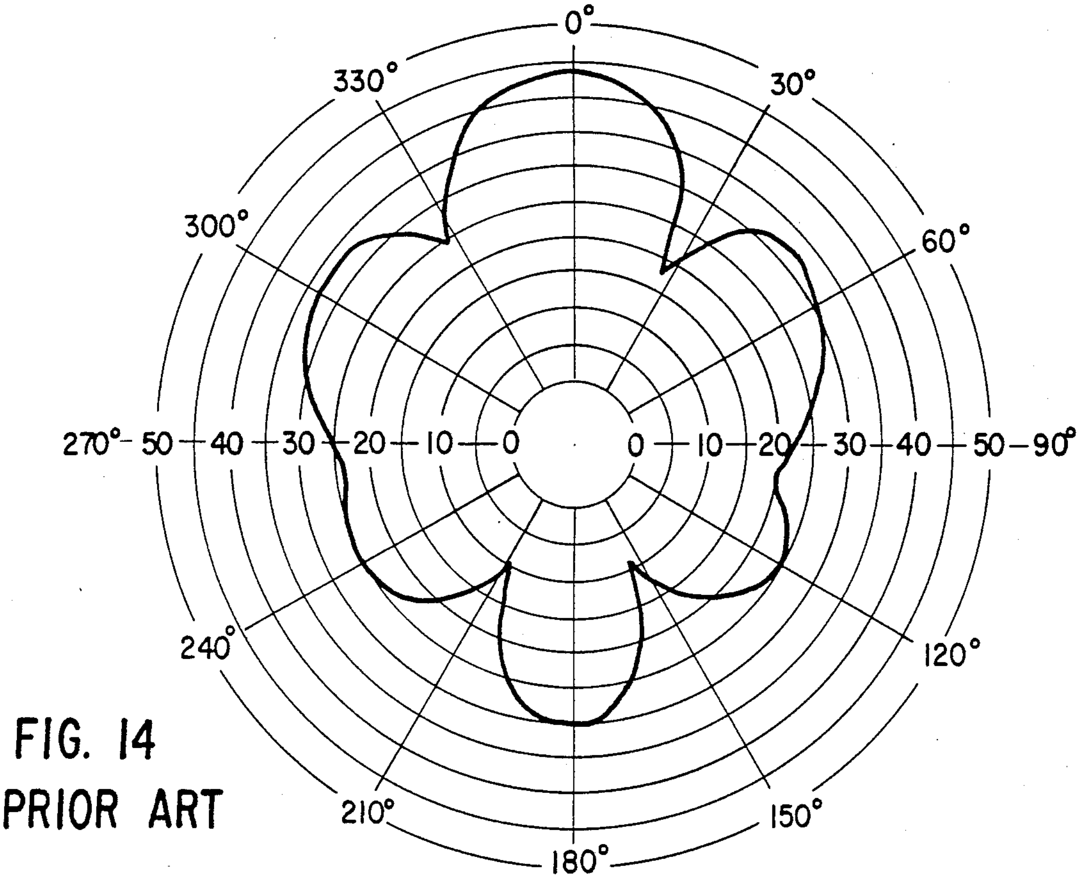
FIG. 14
PRIOR ART

ELECTRONIC OUTDOOR WARNING SIREN

BRIEF SUMMARY OF THE INVENTION

The present invention relates to electronic outdoor warning siren systems which may be mounted on a utility pole or on a roof and are well suited for applications requiring both siren and voice communication such as recreational areas, shopping centers and industrial complexes.

Electronic outdoor warning siren systems are known in the art and typically utilize a plurality of rectangular speakers arranged in circumferentially spaced relation in a common horizontal plane to provide omnidirectional sound propagation. However, such known systems are subject to several disadvantages which are eliminated by the present invention.

The principal disadvantage of known electronic outdoor warning siren systems relates to the inability of such systems to provide substantially uniform sound propagation in all radial directions in a horizontal plane. This problem is caused in part by interference between signals from adjacent speakers thereby resulting in phase cancellation effects causing reduced sound propagation in certain radial directions.

In a conventional electronic outdoor warning siren system, there are four radially directed speakers positioned in a common horizontal plane and circumferentially spaced apart by 90 degrees. The speakers are of the rectangular type and are horizontally oriented. Such a system is subject to the problem of phase cancellation effects due to interference between signals from adjacent speakers causing null and node points with the result that in certain radial directions the sound propagation is substantially less than in other radial directions.

The foregoing problem of irregular sound propagation in different radial directions around a 360° circle cannot be solved in known siren warning systems by simply adding additional speakers in the same horizontal plane. The reason is that additional more closely spaced speakers will increase the interference between sound signals from adjacent speakers resulting in increased phase cancellation effects. It is believed the foregoing explains why prior art electronic outdoor warning siren systems normally do not utilize more than four circumferentially spaced speakers in a given horizontal plane.

It is also known to provide multiple planes of speaker arrays whereby four speakers may be arranged as described above in each of two or more vertically spaced horizontal planes. Such multiple stacks of radially directed speakers will increase the acoustical power of the system in relation to the number of speakers provided. However, such stacking of speakers in multiple horizontal planes will not eliminate the problems discussed above concerning a failure of known warning siren systems to achieve substantially uniform omni-directional sound in all radial directions.

It is further known to aim a plurality of speakers in the same direction and rotate the array in 360° circle to distribute the sound. Conventional systems of this type use speakers operated at the same frequency which causes interference between the sound signals of the adjacent speakers and detracts seriously from uniform sound distribution. The limited sound dispersion angle of known rotating speakers interferes with effective sound dispersion, especially near fringe areas where the warning signal may become unrecognizable due to a narrow beam width pattern and very short duration per rotation.

It is therefore a general object of the present invention to provide an improved electronic outdoor warning siren system which affords substantially uniform stationary omni-directional or rotating unidirectional sound propagation in all radial directions.

A further more specific object of the invention is to provide an electronic outdoor warning siren system utilizing a plurality of generally rectangular speakers which are vertically oriented to achieve increased sound propagation in a horizontal plane by increasing the horizontal dispersion angle of each speaker.

Another more specific object of the invention is to provide an electronic outdoor warning siren system including a plurality of round speakers in combination with a tone generator for driving adjacent speakers with signals of different frequency so each speaker will operate at a frequency different from a speaker adjacent thereto in the same horizontal plane.

A still further object of the invention is to provide an electronic outdoor warning siren system utilizing a plurality of generally circular speakers which are aimed in the same horizontal direction and rotated in a 360° circle for uniform sound propagation in an optimum area of coverage.

An additional object is to provide an electronic outdoor warning siren system where a plurality of radially directed speakers are circumferentially spaced in a common horizontal plane and adjacent speakers are driven at different frequencies with the result that interference and phase cancellation effects in signals from adjacent speakers are significantly reduced thereby affording more uniform omni-directional sound characteristics.

A still additional object is to provide an electronic outdoor warning siren system where a plurality of speakers are aimed in the same direction and rotated about 360°, and adjacent spekers in the same horizontal plane are driven at different frequencies with the result that interference and phase cancellation effects in signals from adjacent speakers are significantly reduced, in comparison to unidirectional speakers driven at the same frequency, and attain more uniform sound distribution.

The foregoing and other objects and advantages of the invention will be apparent from the following description of preferred embodiments, taken in conjunction with the accompanying drawings.

DESCRIPTION OF THE DRAWINGS

FIG. 1 is a broken elevational view showing a first embodiment of an electronic outdoor warning siren system constructed in accordance with the present invention, the embodiment illustrated comprising a pole-mounted installation of the system;

FIG. 2 is a top plan view of the first embodiment of the siren system of FIG. 1 illustrating the circumferential spacing of six radially directed speakers provided in a common horizontal plane;

FIG. 3 is an enlarged fragmentary elevational view illustrating a preferred speaker array of the first embodiment of FIG. 1 comprising a plurality of vertically oriented rectangular speakers arranged in two vertically spaced horizontal planes, the speakers in each plane comprising six circumferentially spaced speakers aimed in radial directions 60 degrees apart, there being a total of twelve such speakers in the system illustrated;

FIG. 4 is a schematic electrical wiring diagram showing a dual tone signal generation system for driving adjacent speakers in the same horizontal plane at different frequencies in accordance with the present invention;

FIG. 5 is a graph comprising a polar distribution pattern illustrating the substantially uniform omni-directional sound propagation characteristics afforded by the first embodiment of the electronic outdoor warning siren system of the present invention;

FIG. 6 is a graph illustrating a polar distribution pattern representative of a prior art electronic outdoor warning siren system;

FIG. 9 is a graph comprising a polar distribution pattern illustrating the substantially uniform omni-directional sound propagation characteristics afforded by the second embodiment of FIGS. 7 and 8 of the electronic outdoor warning siren system of the present invention;

FIG. 10 is a graph illustrating a polar distribution pattern representative of a prior art electronic outdoor warning siren system and being substantially identical to the graph shown in FIG. 6;

FIG. 11 is a top plan view of a third embodiment of the siren system of the present invention where four round speakers are mounted in two vertically spaced horizontal planes with all four speakers defining a common vertical plane and being aimed in the same direction;

FIG. 12 is an enlarged perspective elevational view of the embodiment of FIG. 11 illustrting a housing which is rotatable about a vertical axis;

FIG. 13 is a graph comprising a polar distribution pattern illustrating the uni-directional sound propagation characteristics afforded by the third embodiment of the invention; and FIG. 14 is a graph comprising a polar distribution pattern illustrating a pair of speakers aimed in the same direction along a 0 degree axis in accordance with prior art techniques and establishing nodes and nulls which prevent uniform sound distribution.

Figure 7:
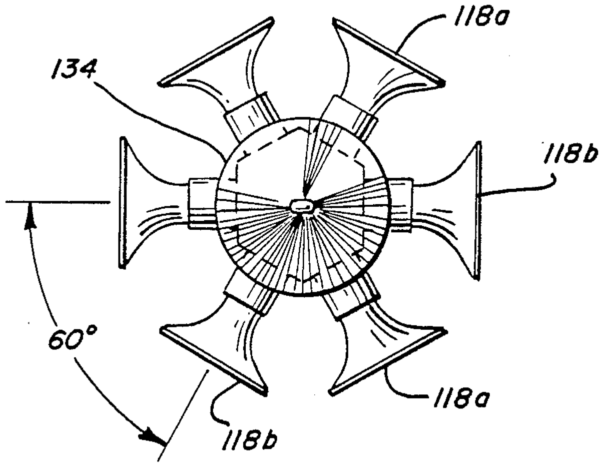
FIG. 7 is a top plan view of a second embodiment of the siren system of the invention illustrating the circumferential spacing of six radially directed circular speakers provided in a common horizontal plane.

Now, in order to acquaint those skilled in the art with the manner of making and using our invention, we shall describe, in conjunction with the accompanying drawings, preferred embodiments of the invention.

DETAILED DESCRIPTION OF THE INVENTION

Referring now to the drawings, FIG. 1 is directed to the first embodiment of the invention and illustrates an electronic outdoor warning siren system 10 mounted on a utility pole 12 having a base 13 extending beneath ground level 14 in a concrete footing 16. It will be understood that the siren system of the present invention may be pole-mounted as in the embodiment illustrated, or it may be mounted in other ways such as a penthouse-mounting or roof-mounting arrangement. The pole 12 preferably extends to at least 35 feet above ground level 14.

The warning siren system 10 includes a plurality of speakers 18 mounted at the upper end of the pole 12, a siren control box 20, a housing 22 for a plurality of batteries, and a service disconnect unit 24. The siren control box 20 will normally contain a control unit (not shown), a plurality of amplifiers (not shown), and a battery charger (not shown). FIG. 1 further illustrates a radio antenna 26, speaker cable 28, speaker assembly ground wire 30, and an iron ground rod 32.

With the exception of the tone generator system of FIG. 4 to be described later herein, the control equipment contained in the housing 20 does not form a part of the present invention and thus will not be specifically described herein. However, it will be understood that in accordance with the first embodiment there are provided twelve of the speakers 18 which are driven from six power amplifiers contained in the control box 20. It is further considered desirable to provide for either wire or radio control, and the embodiment described includes a radio receiver and decoder section (not shown) housed within the control box 20. In addition, it is preferable to provide for full signal operation independent of primary power for up to thirty minutes, and for that purpose batteries are stored in the housing 22, and a battery charger is provided in control box 20.

Reference is now made to FIG. 3 which illustrates the plurality of speakers 18 supported from a common speaker mount 34 preferably equipped at its upper end with a crane lift eyebolt 36. It is preferred that the speakers 18 be of the rectangular type. A specific rectangular type speaker which has been found to work well in the speaker array of the present invention is known as a CJ-46 speaker manufactured by the Atlas Sound Division of American Trading and Production Corporation of Parsippany, N.J.

As shown in FIG. 3, the speakers 18 at their output end have a rectangular profile with a bell opening which is significantly enlongated so when vertically oriented as in the system of the present invention the height of the bell opening is substantially greater than the width, for example, 22 inches high and 12 inches wide. Applicant has found that such a speaker when vertically oriented will afford a substantially increased dispersion angle in the horizontal direction which is desirable in a warning system of the type disclosed, provided serious interference problems are not created between sound signals emanating from adjacent speakers in a common horizontal plane.

As will be described later herein, the present invention includes means for significantly reducing the tendency for signals from adjacent speakers to interfere and create phase cancellation effects. Accordingly, in accordance with the present invention, it has been found that improved results are achieved by increasing the horizontal sound dispersion characteristics of the speakers, and it has been found that the foregoing is increased significantly by arranging the rectangular speakers in a vertical manner as shown in FIG. 3.

In accordance with the first embodiment of the invention, a further feature is to provide six speakers of the above-type in a common horizontal plane with the speakers equally spaced apart at 60° intervals. It is common with siren warning systems heretofore known to provide four horizontally oriented rectangular speakers in a common plane and spaced at 90 degree intervals. In such known systems, it is not feasible to increase the number of speakers in a given horizontal plane because the use of more than four such speakers in one plane will create increased interference from the signals of adjacent speakers resulting in phase cancellation effects which will reduce the uniformity of sound propagation in the entire 360° direction. However, in accordance with a feature of the present invention to be described hereinafter, such interference has been minimized with the result that optimum sound propagation effects throughout a 360° circle can be achieved with six speakers arranged at 60° intervals in a common horizontal plane.

FIG. 3 further shows that in accordance with a preferred embodiment of the present invention there are provided a total of twelve speakers 18 with six speakers arranged in a first horizontal plane at 60° intervals and six additional speakers 18 arranged in a second horizontal plane disposed beneath the first plane. The stacking of horizontal planes of speakers will of course increase the acoustical power of the warning siren system in proportion to the total number of speakers. However, the sound propagation properties of the system, namely, the ability of a plurality of speakers circumferentially spaced in a given horizontal plane to propagate sound in a uniform omni-directional manner in a 360° circle, is not affected by whether the system includes one or a plurality of horizontal planes of such speakers in vertically stacked fashion.

In accordance with the first embodiment of the present invention, where six vertically oriented rectangular speakers 18 are circumferentially spaced apart 60° in a common horizontal plane, it is feasible to provide a system with one plane of six speakers, or two planes of twelve speakers as shown in FIG. 3, or additional planes of speakers. It is believed, however, that due to the advantages of the present invention it is possible to provide a speaker array of twelve speakers as shown in FIG. 3 which will afford important advantages over heretofore known warning siren systems which utilize four horizontal planes of four speakers each for a total of sixteen speakers.

A further important feature of the present invention concerns means for significantly reducing the normal tendency for signals from adjacent speakers to interfere with one another causing significant phase cancellation effects. Applicants have found that two radially directed speakers spaced apart 90° in the same horizontal plane will produce sound signals which significantly interfere with one another with resulting phase cancellation effects causing a sound distribution pattern which is non-uniform so as to propagate sound signals in certain radial directions which are relatively weak compared to the sound signals propagated in other directions. Such characteristics are a serious disadvantage in a warning siren system where the objective is to warn persons within a given radius without regard to the particular radial direction in which such persons are located.

Applicants have discovered that the phase cancellation effects described above are caused by interference between sound signals of the same frequency, and that such interference can be reduced significantly by changing the frequency generated by adjacent speakers in a common horizontal plane. Thus, referring to the six speakers 18 shown in FIG. 2, it is a feature of the present invention to drive the alternate speakers **18*a* at one frequency and the alternate speakers 18*b*** at a different frequency so that adjacent speakers in the same plane will generate sound at somewhat different frequencies.

It has been found that if the sound from adjacent speakers is out of phase even slightly, such as a frequency ratio of 5 to 6, the result is a substantial lessening of the usual phase cancellation effects described above. As a result, it becomes feasible to utilize two additional features of the preferred embodiment described herein which strengthen sound propagation in a horiztonal plane but which would cause unacceptable sound interference and phase cancellation effects if all speakers generated the same frequency, namely, the features comprising (1) an increased number of six speakers arranged at only 60° intervals in the same horizontal plane, and (2) vertically oriented rectangular speakers which increase the horizontal sound dispersion angle.

FIG. 4 is a schematic illustration of a dual tone signal generator for use with the electronic outdoor warning system of the present invention. There is shown a known type of voltage source affording exponential rise and decay, for example, a wail cycle. The voltage source comprises an input to a voltage controlled oscillator integrated circuit (VCO). The VCO output supplies the signal to a pair of divider and symmetry adjustment flip-flops (Sym. Adj.). As a result of the foregoing components, the input signal evolves as two signals having a frequency ratio of 5 to 6. The two output signals from the two flip-flops comprise the input to an output controller which channels the two signals to the proper outputs for distribution to the power amplifiers.

As described earlier herein, in the first embodiment shown which includes a total of twelve speakers, there are provided six amplifiers (not shown) in the control box 20, each amplifier serving to drive two of the speakers 18. Thus, one of the signals from the output controller of FIG. 4 will be directed to three amplifiers which drive the three speakers **18*a* shown in FIG. 2 as well as three similar speakers in the second horizontal speaker plane shown in FIG. 3, and the other signal from the output controller is directed to the other three amplifiers which drive the three speakers 18*b* shown in FIG. 2** as well as three similar speakers in the second horizontal speaker plane.

It will be understood from the foregoing that in any array of six speakers in a common horizontal plane as shown in FIG. 2, any selected speaker will generate a different frequency from an adjacent speaker. As a result, it has been found that a significant reduction in phase cancellation effects is achieved. It is within the scope of the present invention to provide various frequency ratios for adjacent speakers, and the frequency ratio of 5 to 6 described herein is by way of example only. By way of further example, upon activation of the steady signal of the electronic outdoor warning system of the present invention, the two tone generator outputs produce ascending frequency signals which maintain a constant 5 to 6 ratio through the entire exponentially increasing frequency output. The output frequency ratio remains 5 to 6 during the descent caused by cancel of the steady signal.

An added advantage of using the above 5 to 6 frequency ratio is that it produces a dissonant tone quite similar to that produced by conventional electromechanical sirens traditionally used for warning systems. In contrast, electronic warning systems where the speakers operate at a common frequency will produce a sound almost identical to that produced by police car and other emergency vehicle sirens of the electronic type. Certain advantages of the present invention are that it is electronic and capable of full operation with battery standby power without need for primary power, it is capable of providing voice communication, and at the same time it will produce a sound which resembles the known sound produced by traditional electro-mechanical warning siren systems thereby avoiding any confusion with electronic emergency vehicle sirens.

Reference is now made to FIGS. 5 and 6 which are graphs of polar distribution patterns measured in an anechoic chamber for purposes of comparing the electronic warning siren system of the present invention with a known electronic system. FIG. 5 represents a plot of the sound propagation in decibels in any selected radial direction from a warning system comprising six vertically oriented speakers spaced apart 60° in a common horizontal plane as shown in FIG. 2. It will be seen that such a system produces substantially uniform, omni-directional sound propagation.

Specifically, applicants have utilized a somewhat arbitrary definition of uniformity as permitting deviations in sound propagation not exceeding 3 decibels. In other words, applicants have measured the portion of the 360° circle in which the sound signals propagated are within 3 decibels of the maximum signal, it being understood that twice the applied power would be required to restore a 3 dB loss. While the foregoing standard is partly arbitrary, it is believed to be a reasonable method of evaluation of the uniformity of signal propagation, and in accordance with such a standard FIG. 5 illustrates that the warning siren system of the present invention produces uniform, onmi-directional sound throughout the entire 360° circle. Specifically, applicants' system has been tested and shown to provide uniform omni-directional sound at 115 dB(C) at 100 feet within 3.0 dB.

FIG. 6 comprises a polar distribution pattern for a prior art electronic warning siren system of the type having four rectangular speakers arranged at 90° intervals in a common horizontal plane with the speakers being horizontally oriented and driven at the same frequency. It will be seen from FIG. 6 that there are significant null and node points resulting from phase cancellation effects with the result that in certain radial directions the sound propagation is significantly less than in other radial directions. Moreover, if the speakers were increased from four to six and/or were vertically oriented as in applicants' system, such phase cancellation effects would be substantially increased.

Accordingly, the present invention has the advantage of increasing horizontal sound propagation while at the same time increasing the uniform omni-directional characteristics of such sound propagation, and the additional advantage of producing a sound quite similar to the familar dissonant tone of a traditional electromechanical warning siren of the type used for many years in outdoor warning siren systems, thereby avoiding confusion with a conventional electronic vehicular siren.

Figure 8:
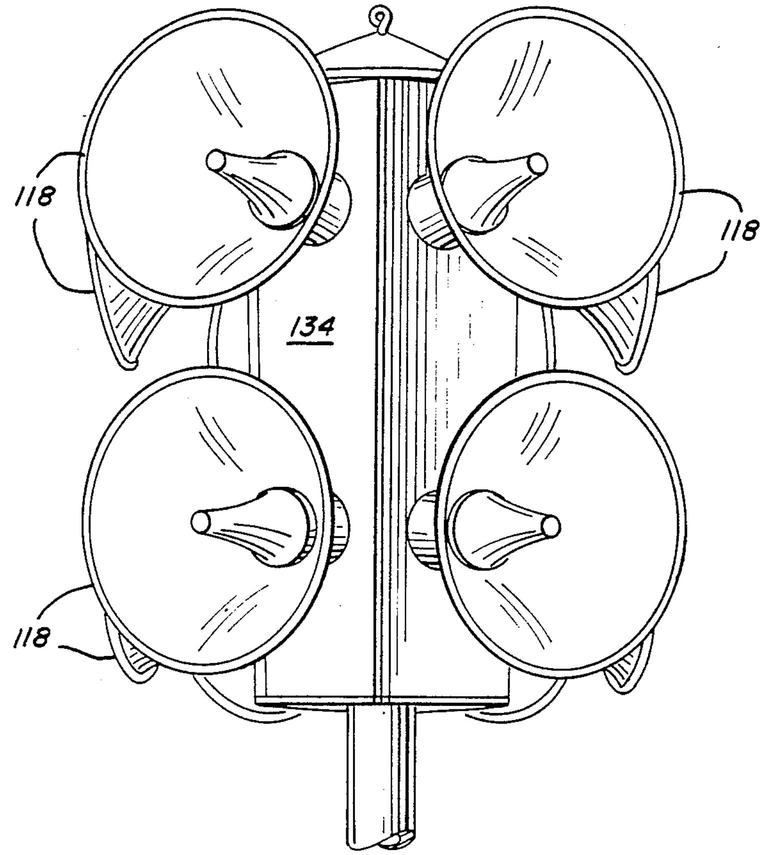
FIG. 8 is an enlarged fragmentary elevational view illustrating a preferred speaker array of the second embodiment of FIG. 7 comprising a plurality of circular speakers arranged in two vertically spaced horizontal planes, the speakers in each plane comprising six circumferentially spaced speakers aimed in radial directions 60° apart, there being a total of twelve such speakers in the system illustrated.

Referring now to FIGS. 7, 8 and 9, there is illustrated a second embodiment of the invention which is directed to an omni-directional electronic outdoor warning siren system of the invention. The embodiment shown in FIGS. 7, 8 and 9, is similar to the previously described system of FIGS. 1 to 6, except that the rectangular speakers 18 thereof have been replaced by a plurality of speakers 118 supported from a common speaker mount 134. In the embodiment of FIGS. 7, 8 and 9, it is preferred that speakers 118 be of the circular type. A specific circular type speaker which has been found to perform well in the speaker array of the invention shown in FIGS. 7, 8 and 9, is known as a model LH-1 Directional Reflex Horn manufactured by University Sound, Altec Sound Products Division, Oklahoma City, Okla.

The common speaker mount 134 and plurality of speakers 118 may be mounted on the utility pole 12 shown in FIG. 1 and having the various components as shown and described in association therewith, including the siren control box 20. As was previously described, the control equipment of the housing 20 does not form a part of the present invention, with exception of the tone generator system of FIG. 4 as previously described and which can likewise be used in conjunction with the embodiment of FIGS. 7, 8 and 9.

As shown in FIG. 8, the speakers 118 have a circular profile at their output ends with a bell opening which is longer than even the significantly elongated bell opening of the foregoing described rectangular speakers 18. Because the circular speakers 118 are longer than the rectangular speaker 18 of the previous embodiment, speakers 118 have a 3 dB increase in power over the rectangular speakers of the prior embodiment. In addition, the circular speakers 118 have a longer and larger mount diameter, and have a lower frequency response than the foregoing rectangular speakers. Therefore, the circular speakers 118 of the second embodiment of the invention emit tones which are lower in frequency and which travel farther than the preceeding rectangular speakers. Another benefit of the tones from the circular speakers 118 is that their sound more closely approximates the frequency emitted by the traditional electromechanical siren which is advantageous to the public.

In obtaining the beneficial increase of power from the circular speakers 118 as compared to the rectangular speakers of the previous embodiment, a limited sacrifice in the optimum uniform horizontal distribution of sound may be attained in comparison to the previous embodiment, although the techniques of the subject embodiment provides a horizontal distribution of sound significantly more uniform than the prior art techniques. In accordance with the second embodiment of the invention, six speakers 118 are mounted in a common horizontal plane with the speakers spaced apart at 60° intervals in a manner as the embodiment of FIGS. 1 through 6. In the same manner, where six speakers 118 are circumferentially spaced apart 60° in a common horizontal plane, it is feasible to provide a system with one horizontal plane of speakers 118, or two horizontal planes of six speakers as shown in FIG. 8, or additional planes of speakers as is appropriate.

The important feature of the present embodiment is also to significantly reduce the normal tendency for signals from adjacent speakers 118 to interfere with one another causing significant phase cancellation effects. This objective is attained by the embodiment of FIGS. 7, 8 and 9, with the previously discussed advantages of increased power at a lower frequency for attaining greater distance of travel of sound and reducing phase cancellation effects. As described in the previous embodiment, the phase cancellation effects inherent in the prior art and which are caused by interference between sound signals of the same frequency, can be reduced in the second embodiment significantly by changing the frequency generated by adjacent speakers 118 in a common horizontal plane. Thus, referring to the six speakers 118 shown in FIG. 7, the alternate speakers 118*a* are driven at one frequency and the alternate speakers 118*b* are driven at a different frequency so that the adJacent speakers in the same plane will generate sound at somewhat different frequency.

The circuit of FIG. 4 illustrating a dual tone signal generator can be similarly employed with the embodiment of FIGS. 7, 8 and 9. Thus, the output of the signals from the output controller of FIG. 4 may be utilized to drive three amplifiers of the six amplifiers coupled to speakers 118 in each of the first and second horizontal planes, if all speakers 118 are employed. By causing each selected circular speaker 118 to drive at a different frequency than the adjacent speaker, significant reduction in phase cancellation effects is achieved, even when employing the circular speakers.

The embodiment of FIGS. 7, 8 and 9, also produces a dissonant tone similar to that produced by conventional electro-mechanical sirens traditionally used for warning systems and long recognized by the public. This result is in contrast to the electronic warning systems operating at a common frequency which sound more like emergency vehicles. The lower frequency of the circular speakers further provides for the increased distance of sound travel which is obviously advantageous when used in connection with an outdoor warning system.

Referring now to FIGS. 9 and 10, there are illustrated a graph of the polar distribution patterns measured in an anechoic chamber for purposes of comparing the electronic warning system of the present embodiment with a prior art system of the same design of that illustrated in the graph of FIG. 6. FIG. 9 represents a plot of the sound propagation in decibels in any selected radial direction from a warning system comprising six speakers spaced apart 60 degrees in a common horizontal plane as shown in FIG. 7. It should be apparent that the sound pattern of the embodiment of FIG. 7 produces increased power over the previous embodiment and a substantially uniform omni-directional sound propagation as compared to the prior art which is shown in FIG. 10. The results shown on the graphs of FIGS. 9 and 10 can be equated to the comparison made between the graphs of FIGS. 5 and 6 and discussed with reference to the previous embodiment.

Particularly, the fact that adjacent speakers in a given horizontal plane in the second embodiment of FIGS. 7 and 8 are driven at different frequencies may be contrasted with the significant null and node points resulting from phase cancellation effects shown in the prior art systems by which sound in certain radial directions is reduced significantly as compared to other directions. Accordingly, the second embodiment of the invention, as described with reference to FIGS. 7, 8 and 9, provides increased power, while at the same time achieves enhanced uniform omni-directional sound propagation as compared to prior systems. The invention further produces the additional advantage of producing a sound similar to traditional electro-mechanical warning signals of the past.

Referring now to FIGS. 11 and 12, there is illustrated still another embodiment of the improved electronic outdoor warning system of the invention. Whereas the preceeding two embodiments are directed to omni-directional systems, the embodiment of FIGS. 11 and 12 is directed to a uni-directional system 210 having a plurality of speakers 218 mounted on the same vertical plane, such that the speakers are aimed in the same radial direction. The array of speakers 218 are rotated through a 360 degree circle in a horizontal plane to direct sound in all radial directions and attain a maximum area of sound propagation. The fact that the speakers 218 are aimed in the same radial direction, as opposed to being in angular relationships as the preceeding embodiments, provides greater area coverage upon movement in a circle about a vertical axis at a suitable standard rate of rotation.

In FIGS. 11 and 12, the four speakers 218 are partially enclosed by a rectangular, thin-walled housing 220 and are mounted therein by suitable means (not shown). The array of speakers 218 extend outward in parallel relationship to each other as an array of four exponentially flared, re-entrant circular speakers disposed as pairs in two horizontal planes in spaced vertical relationship. The warning system 220 may be mounted on a utility pole, such as utility pole 12 which is shown in FIG. 1. Alternatively, outdoor warning system 210 may be mounted by other conventional techniques, such as a penthouse mounting or a roof mounting arrangement. The structural and control components of FIG. 1 may also be employed in conjunction with the mounting and use of system 210 as previously described.

The housing 220 is supported on a base plate 222 and reinforced shaft 224, such that the base plate may be directly coupled to the utility pole by conventional fasteners of any suitable design. The housing 220 not only functions to support a portion of the speakers 218, but also mounts, in a conventional manner, a motor and gear box (not shown) which, through control means positioned in the control box of the tower, e.g., control box 20 in FIG. 1, causes the housing 220 and the array of speakers 218 mounted thereon to rotate about a vertical axis in a circle of 360 degrees and at a rotational rate depending on desired results. The particular technique of mounting the array of uni-directional speakers 218 to attain its rotary motion is deemed conventional, and further description thereof is not necessary for an understanding of the invention.

In the embodiment illustrated in FIGS. 11 and 12, there is shown an array of four speakers from which the sound is aimed in the same direction accomplishing improved results of the invention. It is within the scope of the invention to employ other numbers of speakers 218, such as eight in number, all mounted in horizontal pairs vertically spaced, to attain its similar objectives and improvements. The speakers 218 may comprise any suitable, commercially available units, such as the circular speakers specified in connection with the foregoing embodiment described with reference to FIGS. 7 and 8.

An important feature of the embodiment of FIGS. 11 and 12 is that this system directs sound over a greater area due to the fact that the speakers 218 are aimed in the same direction and rotated 360 degrees. In addition, the embodiment according to FIGS. 11 and 12 accomplishes the same general objective of the preceeding embodiments in reducing interference between adjacent signals which normally cause phase cancellation effects. Applicants have discovered that the phase cancellation effects caused by side by side speakers, which occur in an omni-directional system as described previously, likewise occur in a uni-directional system because in known uni-directional systems the speakers are also driven at the same frequency. As in the case of the preceeding embodiments, speakers 218 in FIGS. 11 and 12 employ speakers 218*a* which are driven at one frequency, while the adjacent speaker 218*b* on the same horizontal plane, is driven at a different frequency so that adjacent speakers in the same horizontal plane will generate sounds at somewhat different frequencies. As was the case in the preceeding embodiments, it has been found that even if the sound from the adjacent speakers in the same horizontal plane is out of phase even slightly, such as in a frequency ratio of 5 to 6, a substantial result is obtained in lessening the usual phase cancellation effects. Since speakers 218*a* and 218*b* are going to be driven at different frequencies of the approximate magnitude as the preceeding embodiments, the dual tone signal generator described in FIG. 4 is a suitable means for driving the uni-directional speakers 218 of the third embodiment of the invention. Thus, upon activation of the electronic outdoor warning system of FIGS. 11 and 12 the two-tone generator output of FIG. 4 produces ascending frequency signals which maintain a constant 5 to 6 ratio through the entire exponential frequency output as in the previous embodiments.

Further, as was the case with the previous advantages, the 5 to 6 output frequency ratio produces a dissonant tone approximating the tone produced by conventional electro-mechanical sirens, so as to not confuse the sound produced by the warning system of the invention with a vehicular emergency siren or the like. As was explained previously, the speakers 218 are caused by a motor assembly unit (not shown) within the housing 220 to move in a circle or orbit of 360° at a conventional rate of rotation.

Reference is made to FIGS. 13 and 14 which are also graphs of polar distribution patterns measured in an anechoic chamber for purposes of comparing the electronic outdoor siren system of FIGS. 11 and 12 with a pair of speakers operated at the same frequency in accordance with standard practice.

In FIG. 14, illustrating test results of prior art techniques, there is shown the sound dispersion pattern in decibels when like signals are introduced into adjacent signal sources both aimed in the same direction at a given instantaneous moment. From FIG. 14, it is clear that distinct phase cancellation nodes and nulls are created in the horizontal sound dispersion at each instant. At any instant during the rotation of side by side speakers driven at same frequency, the sound could be unrecognizable in the areas shown by the nulls and nodes.

In contrast, the graph of FIG. 13 represents a plot of the sound propagation at any instant of the two side by side speakers 218 aimed in the same direction along 0° axis and operating at a frequency ratio of 5 to 6 as previously described in accordance with the invention. It is clear from the plot of FIG. 13 that the system of the invention eliminates the null points of a pair of side by side speakers operating at the same frequency and attains a wider beam of uniform sound propagation as it is swept around in a 360° circle. Accordingly, the system of the invention of FIGS. 11 and 12 attains significantly improved uniformity of horizontal sound dispersion to direct a greater exposure of sound to a person at a given distance away when compared to speakers lying side by side and operated at the same frequency.

What is claimed is:

1. An electronic outdoor warning siren system, which comprises:

speaker mounting means for supporting a plurality of speakers;

a plurality of speakers connected to said speaker mounting means and arranged in a common horizontal plane;

electronic tone generator means for driving adjacent speakers of said plurality of speakers with signals of different frequency so each speaker will operate at a frequency different from a speaker adjacent thereto in the same horizontal plane, whereby the uniformity of sound distribution is enhanced.

2. An electronic outdoor warning siren system as described in claim 1, in which each of said plurality of speakers is round.

3. An electronic outdoor warning siren system as described in claim 1, in which each of said plurality of speakers is rectangular and is oriented with its longest dimension generally vertical so as to increase horizontal sound dispersion.

4. An electronic outdoor warning siren system as described in claim 1, including at least four speakers arranged in a common horizontal plane, said speakers being circumferentially spaced equally and being aimed radially outwardly.

5. An electronic outdoor warning siren system as described in claim 4, in which there are six speakers arranged in said common horizontal plane.

6. An electronic outdoor warning siren system as described in claim 5, in which there are six speakers arranged in a first horizontal plane and six additional speakers arranged in a second horizontal plane vertically spaced from said first horizontal plane.

7. An electronic outdoor warning siren system as described in claim 1, comprising at least two speakers arranged in a horizontal plane, said speakers also defining a common vertical plane and being aimed in the same direction.

8. An electronic outdoor warning siren system as described in claim 1, in which said tone generator means produces two signals having a frequency ratio of approximately 5 to 6.

9. An electronic outdoor warning siren system as described in claim 1, including at least four speakers arranged in two verticlly spaced horizontal planes, said four speakers defining a common vertical plane nd being aimed in the same generally horizontally direction.

* * * * *